United States Patent
Lin

(10) Patent No.: US 9,134,362 B2
(45) Date of Patent: Sep. 15, 2015

(54) METHOD FOR AUTOMATICALLY SORTING LEDS ACCORDING TO ELECTROSTATIC RESISTANCE AND SYSTEM USING THE SAME

(71) Applicant: TAIWAN POWER TESTING TECHNOLOGY CO., LTD., New Taipei (TW)

(72) Inventor: Yu-Chiang Lin, New Taipei (TW)

(73) Assignee: Taiwan Power Testing Technology Co., Ltd., New Taipei (TW)

( * ) Notice: Subject to any disclaimer, the term of this patent is extended or adjusted under 35 U.S.C. 154(b) by 275 days.

(21) Appl. No.: 13/911,312

(22) Filed: Jun. 6, 2013

(65) Prior Publication Data

US 2014/0176178 A1  Jun. 26, 2014

(30) Foreign Application Priority Data

Dec. 25, 2012  (TW) .............................. 101149907 A

(51) Int. Cl.
*G01R 31/00* (2006.01)
*G01R 31/26* (2014.01)

(52) U.S. Cl.
CPC ........ *G01R 31/2635* (2013.01); *G01R 31/2642* (2013.01)

(58) Field of Classification Search
CPC .. H01L 33/62; H01L 29/458; G01R 31/2642; G01R 31/01; G01R 31/2635; G01R 31/001; G01R 31/026; G01R 31/275
See application file for complete search history.

(56) References Cited

U.S. PATENT DOCUMENTS 4,775,640 A * 10/1988 Chan ............................. 438/16
8,052,317 B2 * 11/2011 Kim ............................. 362/613

* cited by examiner

*Primary Examiner* — Tung X Nguyen
(74) *Attorney, Agent, or Firm* — Kolisch Hartwell, P.C.

(57) ABSTRACT

Disclosed is a method for automatically sorting LEDs (light emitting diode) according to electrostatic resistance and a system using the same. The system includes a transport carrier for laying LEDs and passing LEDs through an electrostatic discharging zone, a lightening evaluating zone, and a sorting zone in sequence. An electrostatic discharging device discharges an electrostatic power to the LED in the electrostatic discharging zone. Furthermore, a lighting device inputs a lightening power to the LED in the lightening evaluating zone. Moreover, an evaluating device in the evaluating zone generates an evaluating signal to a sorting device in the sorting zone according to the lighting condition of the LED for allowing the sorting device to sort LEDs according to electrostatic resistance. Thereby the reliability both for the failure rate and the detection rate can be raised.

9 Claims, 10 Drawing Sheets

METHOD FOR AUTOMATICALLY SORTING LEDS ACCORDING TO ELECTROSTATIC RESISTANCE AND SYSTEM USING THE SAME

CROSS-REFERENCE TO RELATED APPLICATION

This application claims priority to Taiwanese Patent Application No. 101149907, filed Dec. 25, 2012, which is hereby incorporated by reference.

FIELD OF THE INVENTION

The present invention relates to a method for testing LEDs according to electrostatic resistance, and more particularly, to a method for automatically sorting LED according to electrostatic resistance and system using the same.

BACKGROUND OF THE INVENTION

Electrostatic discharge (ESD) is generated due to mutual contact or separation from each other of at least two articles. These kinds of phenomenon, i.e., mutual contact and separation from each other, are referred to as triboelectic charging, which is related to a rapid charge transfer between different articles respectively having different surface potential level. The so generated charge is then remained on the surface of the articles to lead to ESD. The charge imbalance of articles will create an electrostatic field. Furthermore, the electrostatic field will continue to accumulate and then cause the electrical charge transfer of articles due to the different surface potential. This phenomenon is known as ESD which is one of the main reasons for device failure in the semiconductor industry. The ESD damage for the semiconductor industry surveyed by the American National Standards Institute (ANSI) shows that, the ESD damage leads to an average loss of product in the range between 8% and 33%.

An electronic device will be permanently damaged when high-voltage electrostatic passes therethrough. The failure of electronic device caused by ESD includes electricity leakage, short circuit, and brightness down or burned.

Machine Model (MM) refers to an electrostatic discharge from a charged machine. The charged machine contacts an electronic device and discharges electrostatic from the electronic device to lead to the failure of the electronic device. The static electricity from MM is generally eliminated by a grounding process.

Human Body Model (HBM) is another common type of ESD that a charged human body directly transfers its accumulated electrostatic charge to an electronic device by touching it, and which is also most difficult for being completely eliminated. Electrostatic accumulated in the human body is up to 3 kV, and electrostatic accumulated in clothing is up to 8 kV in a dry environment. When a human with a positive potential or a negative potential touches one electronic device, the accumulated electrostatic is discharged and flows into the electronic device to pass a very high voltage or current to the electronic device to lead to a serious irreversible damage to the electronic device. Therefore, the staffs who have chance to touch the electronic device in a factory must be equipped with anti-static equipment for safety of device.

In the practice, LEDs are tested and classified, referred as sorted in the present invention, with regard to electrostatic resistance by using random sampling method. First, an electrostatic gun, handheld by the staff, discharges an electrostatic to LEDs. Then, the LEDs characteristics of brightness, electrical resistance value and so on are detected. Finally, the LEDs failure rate is estimated according to the random sampling ratio. The estimated LEDs failure rate is approximate to the LEDs real failure rate when a high percentage of random sampling ratio is achieved. When a high estimated failure rate for the LEDs is obtained, we can predict that the most of these LEDs have a weak electrostatic resistance for the testing voltage value. Conversely, when a low estimated failure rate for the LEDs is obtained, we can predict that the most of the LEDs have a strong electrostatic resistance for the testing voltage value.

SUMMARY OF THE INVENTION

The random sampling method implemented by human wastes of labor and cost. Accordingly since the random sampling ratio for testing electrostatic resistance of LEDs is hard to be increased, it leads to a difference gap between the estimated failure rate and the real failure rate, which will cause a low reliability of estimated failure rate.

Furthermore, the staffs in the factory may still damage the LEDs by HBM ESD although the staffs equip with anti-static equipments to cause the failure of the LEDs.

Therefore, the present invention has been made in view of the above circumstances and provides a method for automatically sorting LEDs according to electrostatic resistance and system using the same, and thus the random sampling ratio is increased and the labor cost is down.

The present invention overcomes the drawbacks of the prior art, and provides a method for automatically sorting LED according to electrostatic resistance, the method including steps of: (a) laying, on a transport carrier, a LED to be tested; (b) transporting the LED for passing the LED through an electrostatic discharging zone, a lightening evaluating zone, and a sorting zone in sequence along a detecting path by the transport carrier; (c) in the electrostatic discharging zone, discharging an electrostatic power with a detecting voltage to the LED on the transport carrier through an electric conducting member by an electrostatic discharging device during an electrostatic discharging period; (d) in the lightening evaluating zone, inputting a lightening power to the LED on the transport carrier via an electrode of the LED electrically connecting with the electric conducting member by a lighting device and transmitting an evaluating signal to a sorting device according to the lighting condition of the LED; and (e) in the sorting zone, sorting the LED for moving the LED from the transport carrier to an collecting zone by the sorting device according to the evaluating signal.

According to an embodiment of the present invention, in the step (c), the electrostatic power is a pulse-type electrostatic power.

According to an embodiment of the present invention, in the step (b) it further comprises a step of transporting the LED for passing the LED through an electrostatic eliminating zone existing between the electrostatic discharging zone and the lightening evaluating zone, and in a process between the step (c) and the step (d) it comprises a step of moving the transport carrier to the electrostatic eliminating zone for eliminating the electrostatic within the LED through the electric conducting member by means of an electrostatic eliminating device.

According to an embodiment of the present invention, in the step (d) it further includes a step of eliminating the electrostatic within the LED through the electric conducting member by the lighting device before inputting the lightening power to the LED.

According to an embodiment of the present invention, before the step (d), it further comprises a step of arranging the electrode of the LED according to the power output of the lighting device to arrange a positive electrode and a negative electrode of the LED.

The present invention overcomes the drawbacks of the prior art, and provides a system for automatically sorting a LED according to electrostatic resistance, comprises: a transport carrier, an electrostatic discharging device, a lighting device, an evaluating device, and a sorting device. The transport carrier, provided with an electric conducting member, for laying a LED and passing the LED through an electrostatic discharging zone, a lightening evaluating zone, and a sorting zone in sequence along a detecting path. The electrostatic discharging device provided in the electrostatic discharging zone, the electrostatic discharging device being electrically connected with the electric conducting member for discharging an electrostatic power with a detecting voltage to the LED on the transport carrier through the electric conducting member while the transport carrier is in the electrostatic discharging zone. The lighting device and an evaluating device provided in the lightening evaluating zone, the lighting device being electrically connected with the electric conducting member for inputting a lightening power to the LED on the transport carrier through the electric conducting member, and the evaluating device transmitted an evaluating signal according to the lighting result of the LED while the transport carrier is in the lightening evaluating zone. The sorting device provided in the sorting zone, the sorting device connected with the evaluating device to sort the LED for moving the LED from the sorting zone to a collecting zone according to the evaluating signal.

According to an embodiment of the present invention, the transport carrier further includes an insulating member, and the electric conducting member is disposed on the insulating member.

According to an embodiment of the present invention, the system further comprises an electrode arranging member in the electrostatic discharging zone.

According to an embodiment of the present invention, the system further comprises an electrode arranging member in the lightening evaluating zone.

The technical means adopted by the present invention are capable of detecting the electrostatic resistance for mass amount of LEDs at the same time and are capable of significantly increasing the sampling ratio to 100%. Further, the method increases the reliability of failure rate to previously prevent from the occurrence of failure after the lighting device has been bought by customers in order to meet the customer satisfaction.

The embodiment adopted by the present invention described with the drawings as follow.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
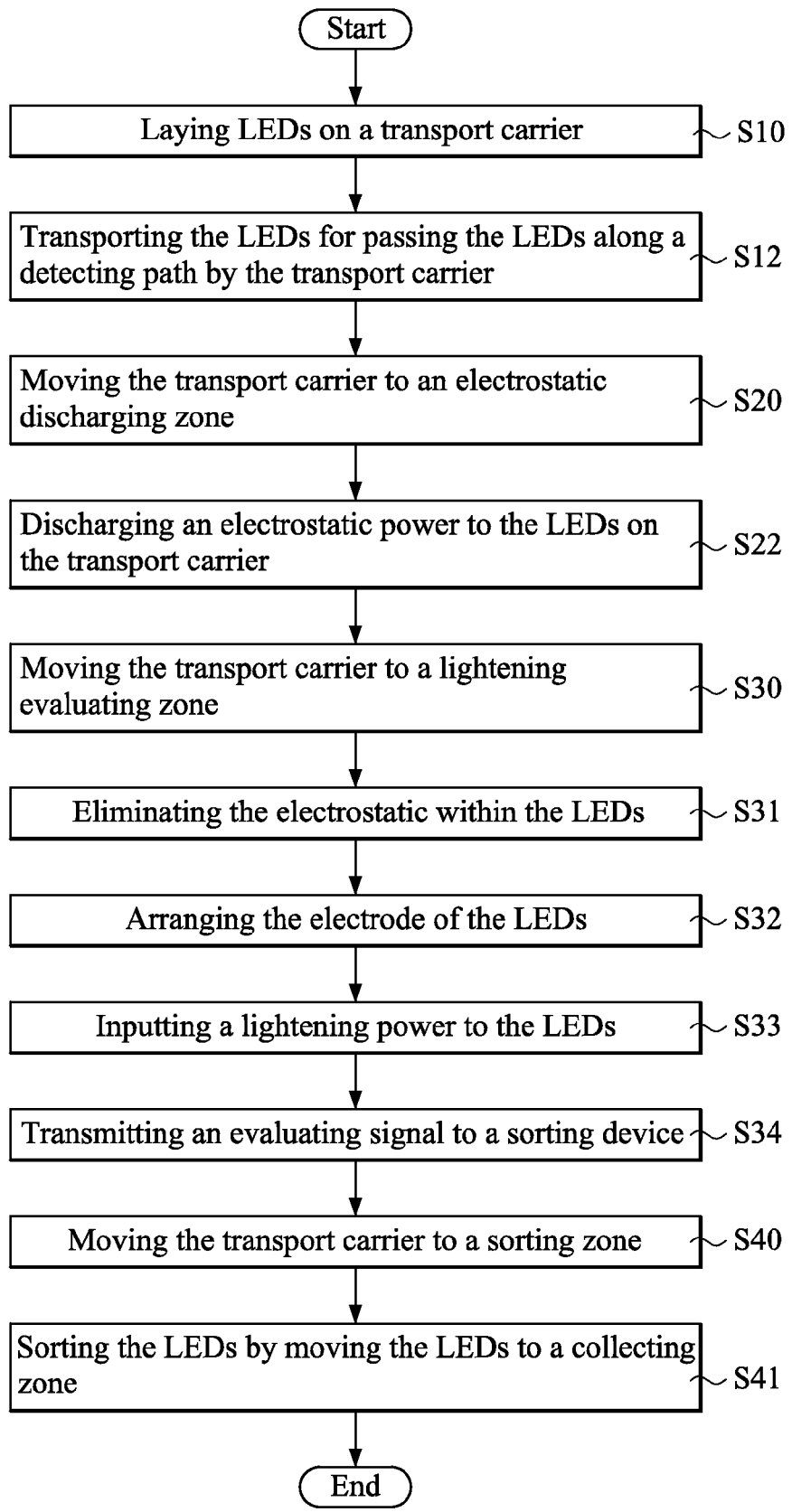
FIG. 1 is a flow chart of a method for automatically sorting LEDs with regard to electrostatic resistance according to the first embodiment of the present invention.
Figure 2:
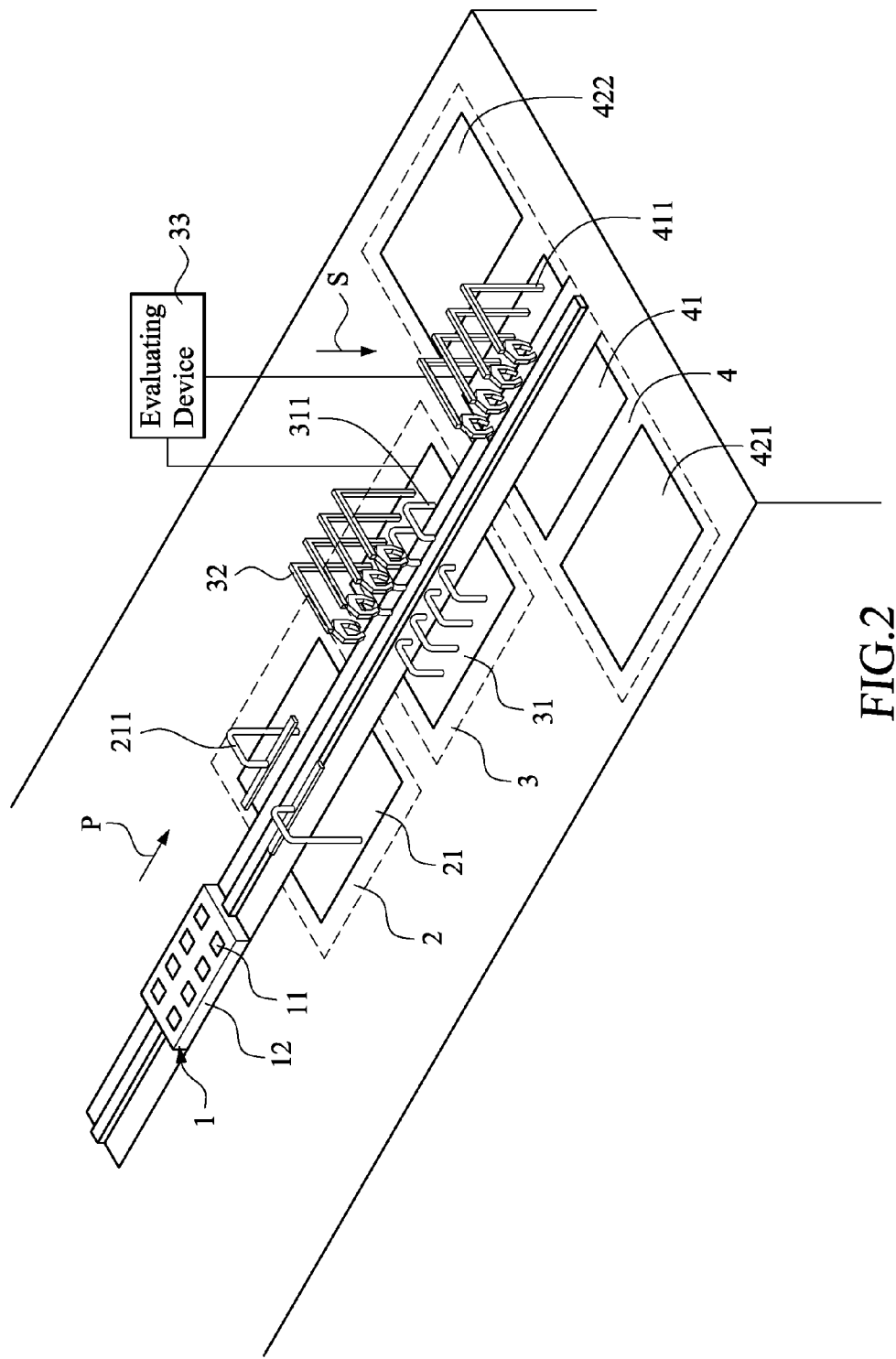
FIG. 2 is a schematic drawing of a system for automatically sorting LEDs with regard to electrostatic resistance according to the first embodiment of the present invention.
Figure 3:
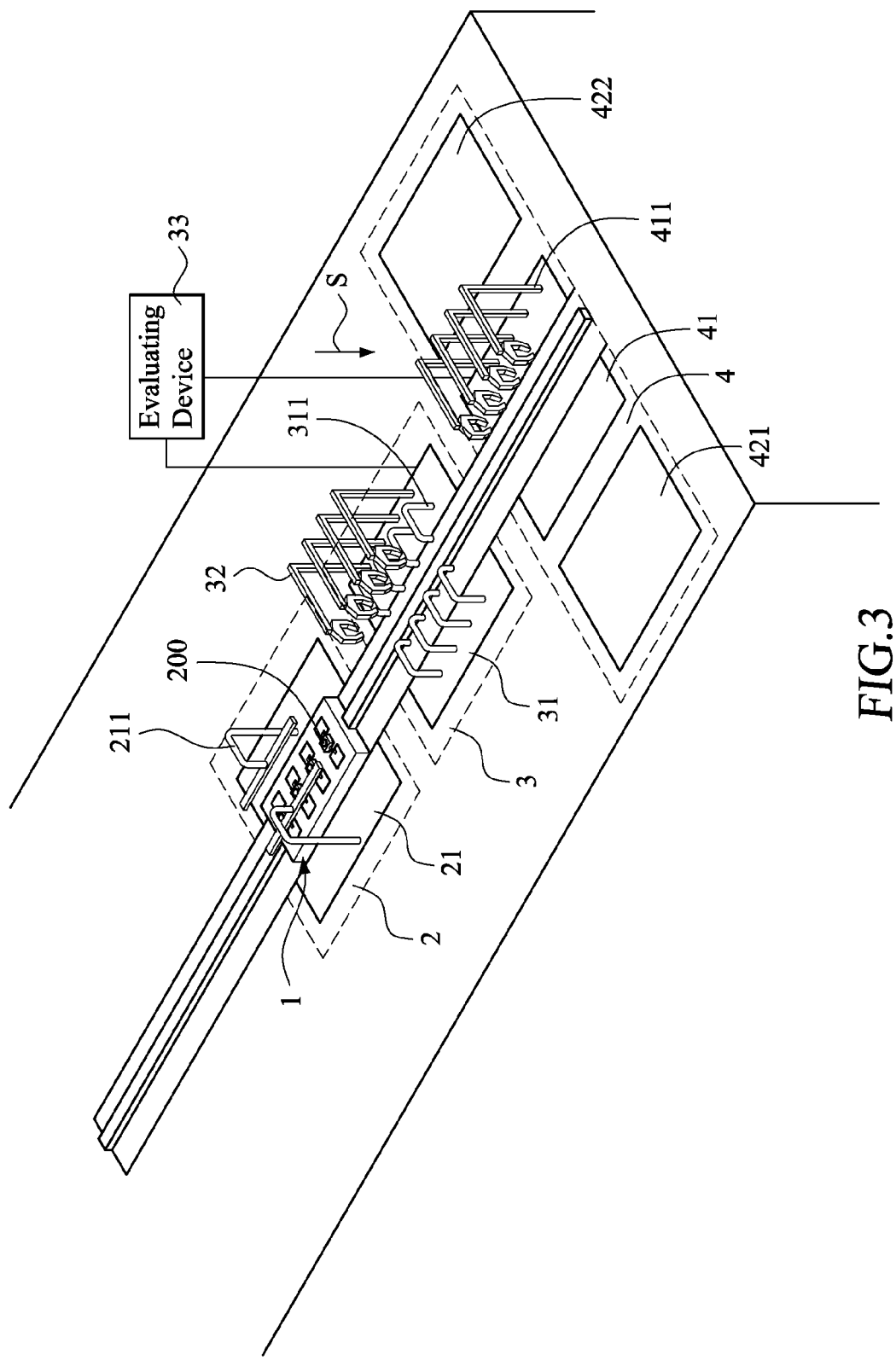
FIG. 3 is the first schematic drawing illustrating a operate state of a system for automatically sorting LEDs with regard to electrostatic resistance according to the first embodiment of the present invention.
Figure 4:
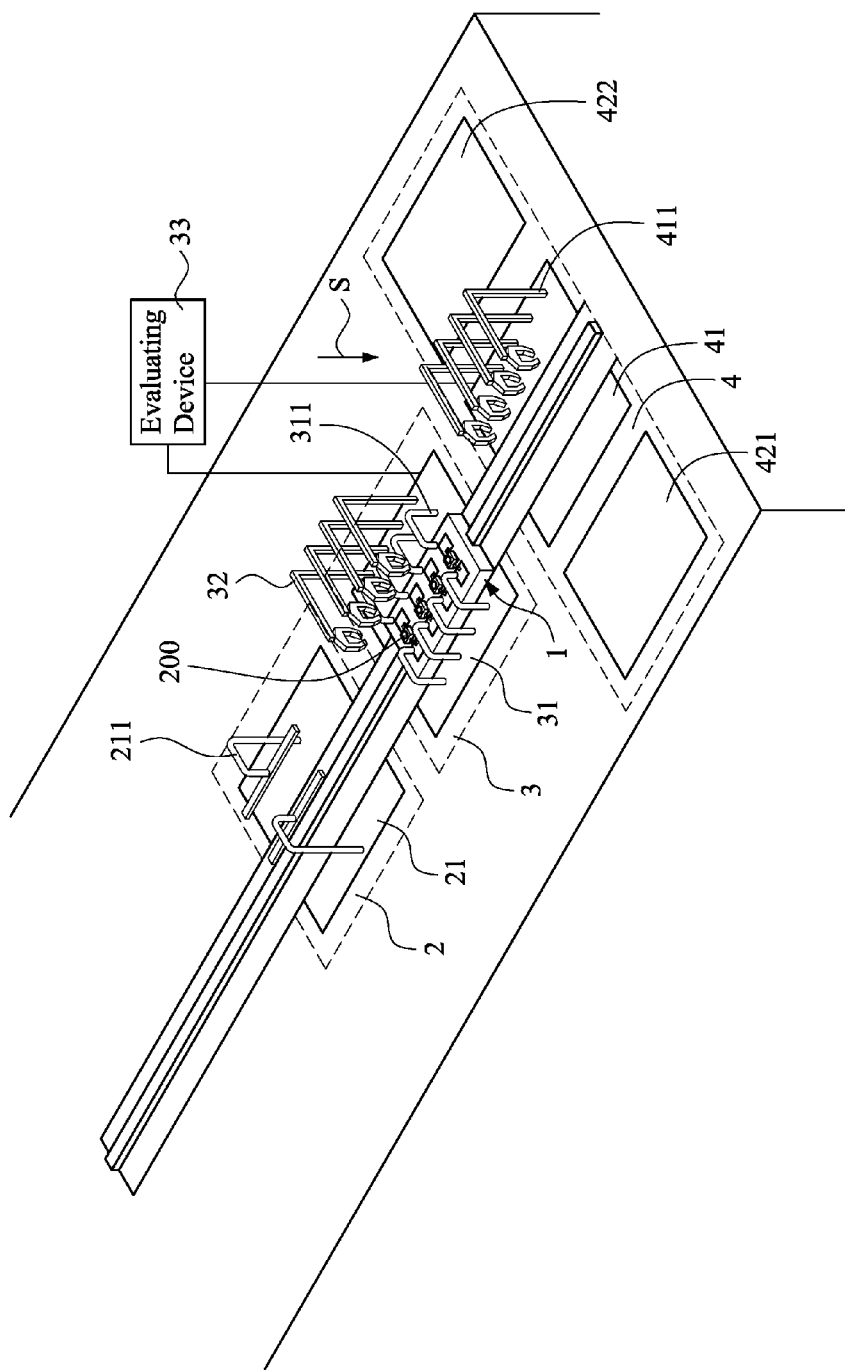
FIG. 4 is the second schematic drawing illustrating a operate state of a system for automatically sorting LEDs with regard to electrostatic resistance according to the first embodiment of the present invention.
Figure 5:
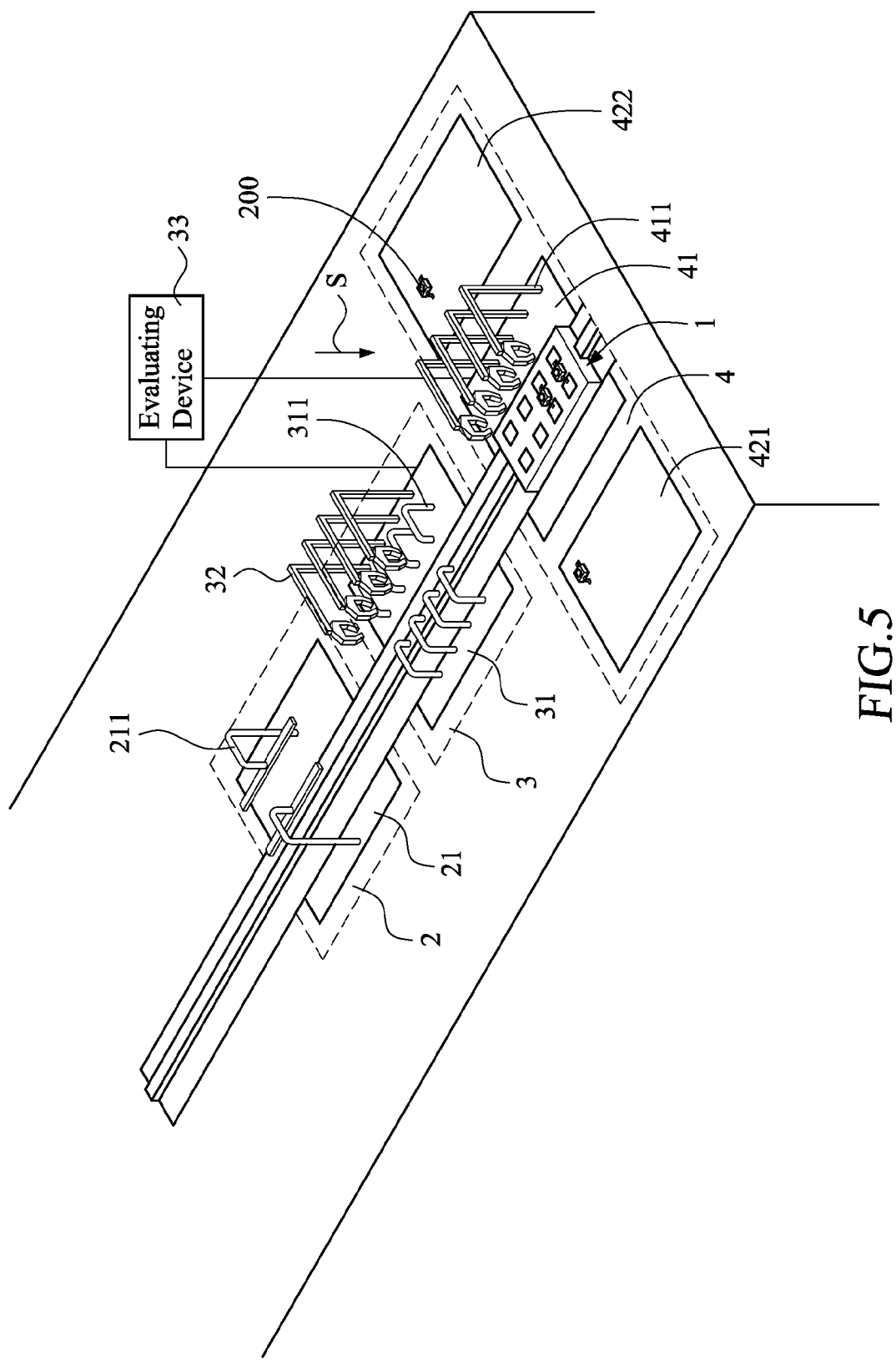
FIG. 5 is the third schematic drawing illustrating a operate state of a system for automatically sorting LEDs with regard to electrostatic resistance according to the first embodiment of the present invention.

Please refer to FIG. 1. FIG. 1 is a flow chart of a method for automatically sorting LEDs with regard to electrostatic resistance according to the first embodiment of the present invention. The method includes steps of: laying LEDs on a transport carrier (step 10), transporting the LEDs for passing the LEDs along a detecting path by the transport carrier (step 12), moving the transport carrier to an electrostatic discharging zone (step 20), discharging an electrostatic power to the LEDs on the transport carrier (step 22), moving the transport carrier to a lightening evaluating zone (step 30), eliminating the electrostatic within the LEDs (step 31), arranging the electrode of the LEDs (step 32), inputting a lightening power to the LEDs (step 33), transmitting an evaluating signal to a sorting device (step 34), moving the transport carrier to a sorting zone (step 40), and sorting the LEDs by moving the LEDs to a collecting zone (step 41).

Please refer to FIG. 2 to FIG. 5 in light of FIG. 1 to illustrate the detail according to the first embodiment of the present invention as below.

In the embodiment, the system for automatically sorting LED according to electrostatic resistance 100 includes a transport carrier 1, an electrostatic discharging zone 2, a lightening evaluating zone 3, and a sorting zone 4. The transport carrier 1 is provided with the LEDs to be tested, and passes through an electrostatic discharging zone 2, a lightening evaluating zone 3, and a sorting zone 4 in sequence. The amount of the LEDs 200 is only for illustration but is not limited.

First, the LEDs 200 are provided on the transport carrier (step 10). Specifically, the transport carrier 1 includes an electric conducting member 11 and an insulating member 12. The electric conducting member 11 is disposed on the insulating member 12. The LEDs 200 is electrically connected with the electric conducting member 11. Next, the LEDs 200 is transported by the transport carrier 1 along a detecting path P (step 12). The detecting path P extends through the electrostatic discharging zone 2, the lightening evaluating zone 3, and the sorting zone 4 in sequence.

Then, the transport carrier 1 is moved to the electrostatic discharging zone 2 (step 20). In detail, there is an electrostatic discharging device 21 provided in the electrostatic discharging zone 2. The electrostatic discharging device 21 are able to discharge an electrostatic power with a detecting voltage according to various parameter settings. An electrostatic conducting member 211 of the electrostatic discharging device 21 is electrically connecting with the electric conducting member 11. Then, the electrostatic discharging device 21 discharges the electrostatic power with the detecting voltage to the LEDs 200 on the transport carrier 1 via the electric conducting member 11. The electrostatic is remained in the LEDs 200 during an electrostatic discharging period (step 22).

Afterward, the transport carrier 1 is moved to the lightening evaluating zone 3 (step 30). More specifically, there is a lighting device 31, an electrode arranging member 32, and an evaluating device 33 provided in the lightening evaluating zone 3. The lighting conduction member 311 of the lighting device 31 is electrically connected with the electric conducting member 11. In the present embodiment, the system for automatically sorting LEDs according to electrostatic resistance 100 does not need to be provided with an electrostatic eliminating device, since the LEDs 200 and the lighting conduction member 311 will stabilize the electrical potential with each other, due to the potential difference between the LEDs 200 and the lighting conduction member 311. The LEDs 200 will discharge the electrostatic to the lighting conduction member 311, so the electrostatic within the LEDs 200 will be eliminated (step 31). The electrode arranging member 32 is provide to arrange the positive electrode and negative electrode of the LEDs 200 according to the direction of the electrical flow corresponding to the lighting device 31 (step 32). The electrode of the LEDs 200 can be previously realized in various ways, such as, reading the sign of the electrode of the LEDs 200 or measuring the electrical resistance value of the LEDs 200 by an electric meter. Therefore, the electrode of the LEDs 200 can be arranged in a way corresponding to a direction of current flow of the lighting device 31 before the LEDs 200 is disposed on the transport carrier 1. Accordingly, the electrode arranging member 32 is not an element in necessity, and the step 32 is also a step in necessity. The lighting device 31 is able to generate a lightening power according to a setting value. The lighting conduction member 311 is provided to transmit the lightening power to the electrode of the LEDs 200 on the transport carrier 1 (step 33). If the LEDs 200 can be lighted by the lightening power, it means that the LEDs 200 are able to sustain the electrostatic. If the LEDs 200 can be lighted by the lightening power, but the brightness of the LEDs 200 is weak, it means that the LEDs 200 are damaged by the electrostatic. If the LEDs 200 cannot be lighted by the lightening power, it means that the LEDs 200 are not able to sustain the electrostatic. The evaluating device 33 is provided to detect the resistance value of the LEDs 200 via the lighting conduction member 311, and then is transmitting an evaluating signal S to the sorting zone 4 according to the lighting condition of the LEDs 200 (step 34). For example, the evaluating signal S is excellent if the resistance value of the LEDs 200 is small, and the evaluating signal S is defective if the resistance value of the LEDs 200 is large, and the evaluating signal S is qualified if the resistance value of the LEDs 200 is medium.

Finally, moving the transport carrier 1 to the sorting zone 4 (step 40). There is a sorting device 41 provided in the sorting zone 4 and two collecting zones 421, 422. The sorting device 41 is connected with the evaluating device 33. The sorting device 41 sorts the defective LEDs 200 from the sorting zone 4 to the collecting zone 421, sorts the qualified LEDs 200 from the sorting zone 4 to the collecting zone 422, and holds the excellent LEDs 200 on the transport carrier 1 according to the evaluating signal S for subsequent operations (step 41). However, the present invention is not limited to this, the sorting zone is provide with one collecting zone or several collecting zones in other embodiment.

Figure 6:
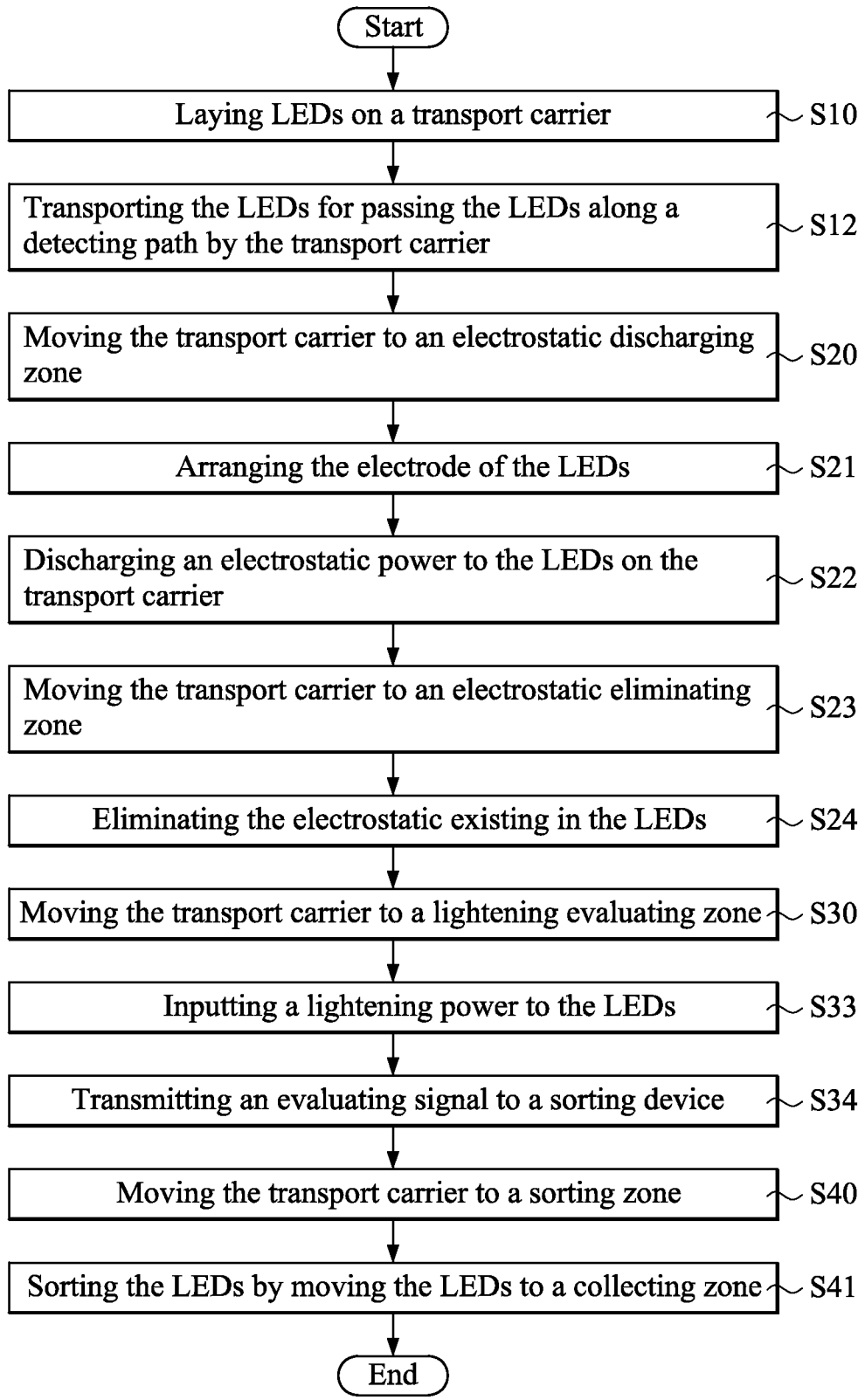
FIG. 6 is a flow chart of a method for automatically sorting LEDs with based on electrostatic resistance according to the second embodiment of the present invention.
Figure 7:
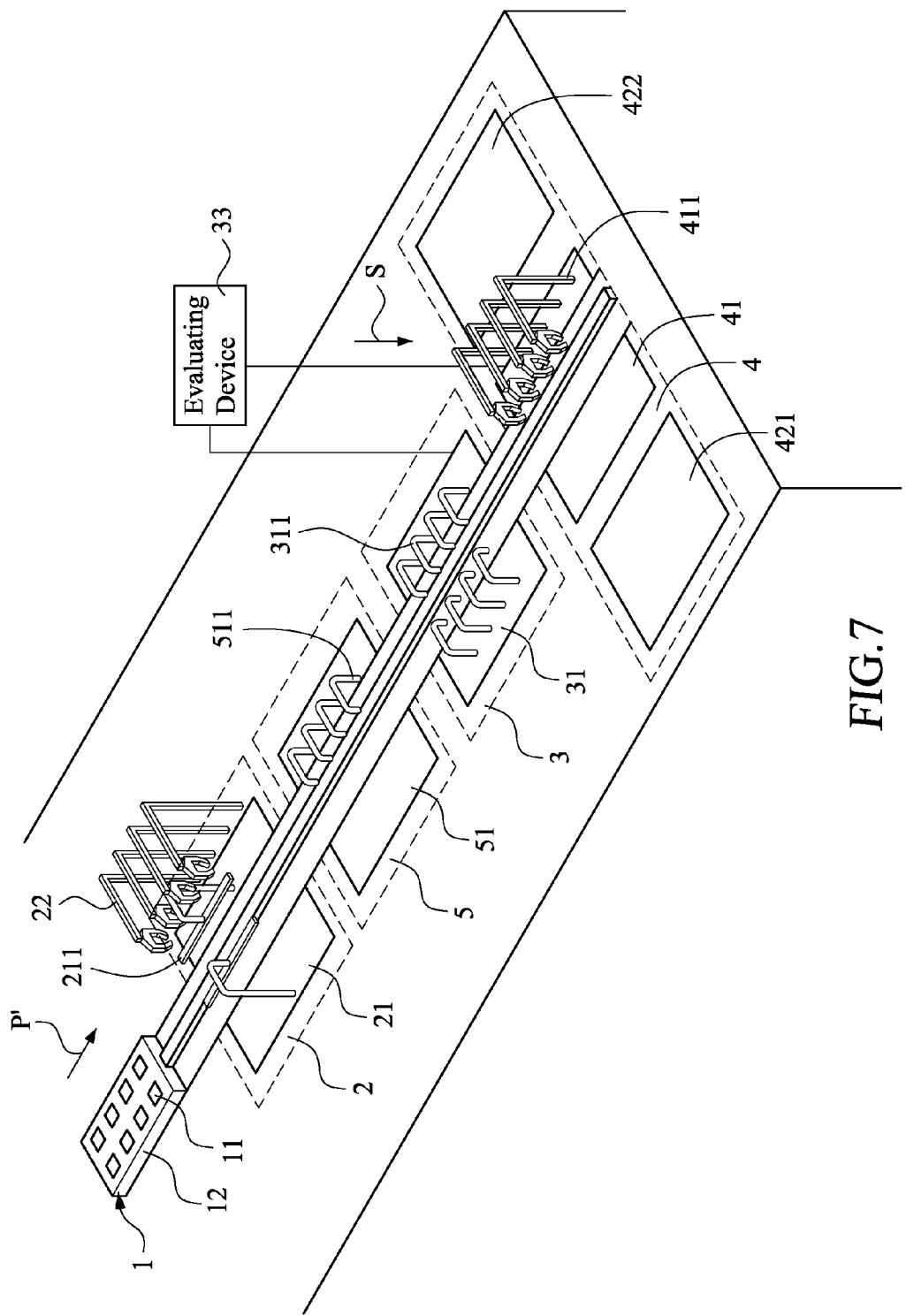
FIG. 7 is a schematic drawing of a system for automatically sorting LEDs with regard to electrostatic resistance according to the second embodiment of the present invention.
Figure 8:
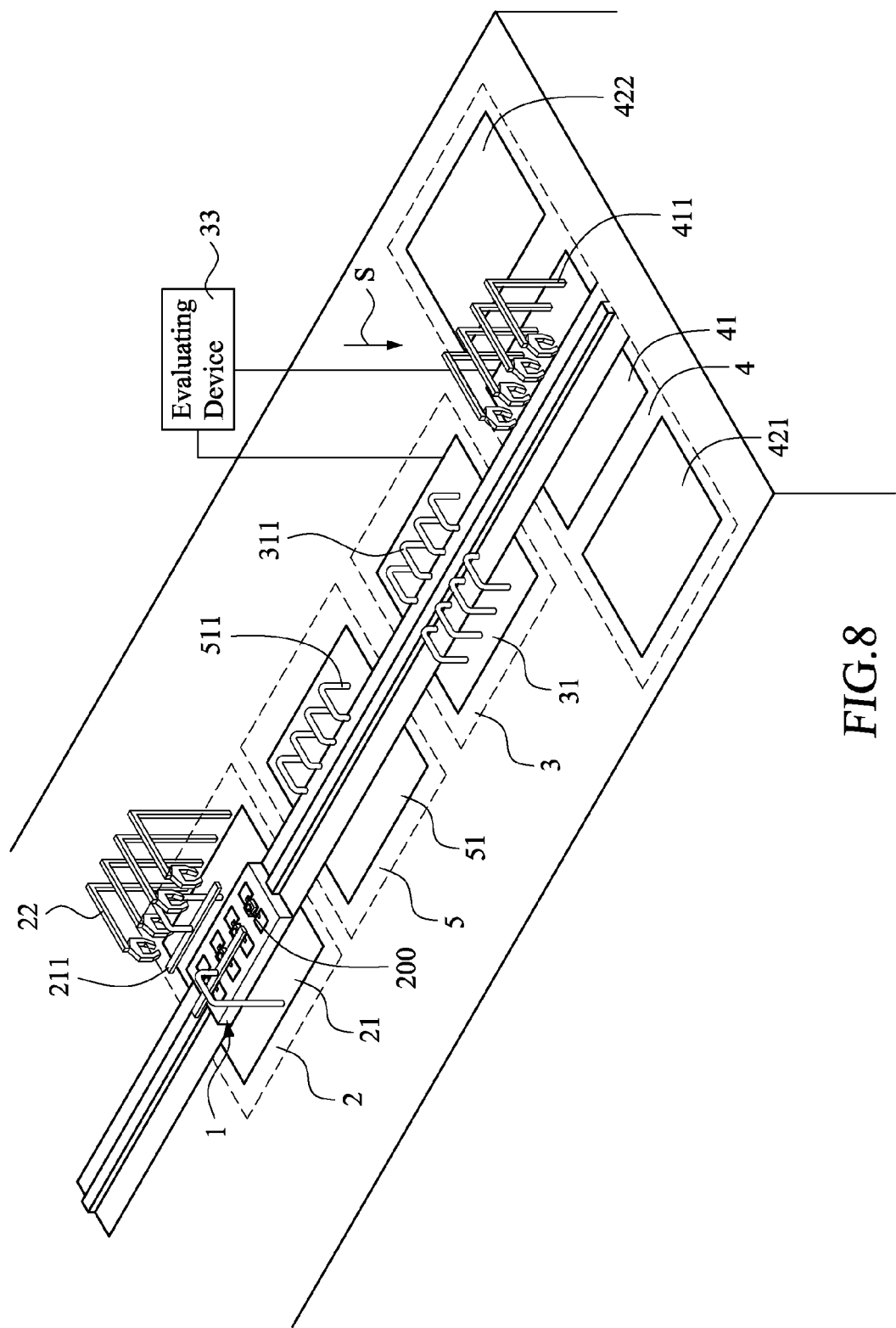
FIG. 8 is the first schematic drawing illustrating a operate state of a system for automatically sorting LEDs with regard to electrostatic resistance according to the second embodiment of the present invention.
Figure 9:
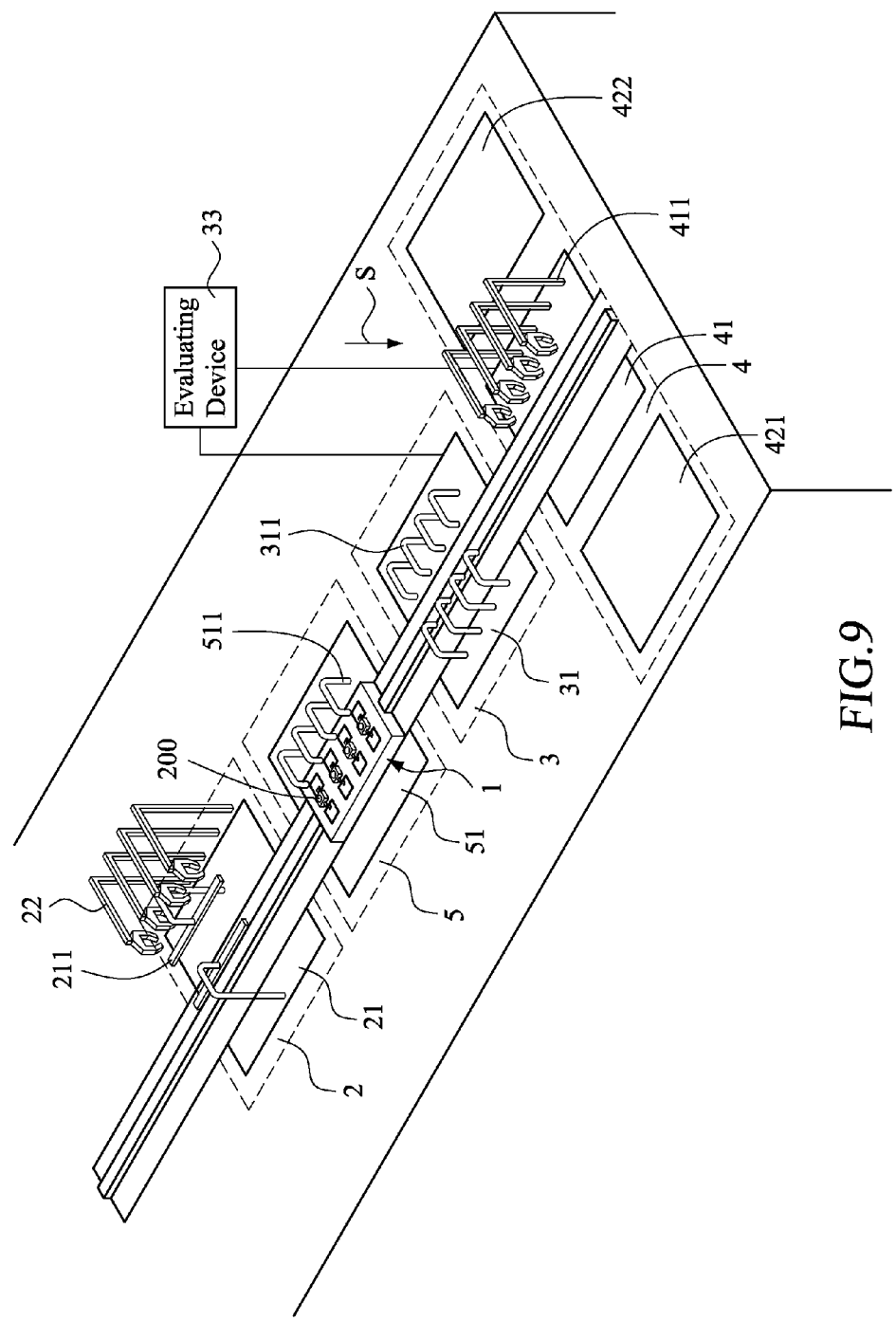
FIG. 9 is the second schematic drawing illustrating a operate state of a system for automatically sorting LEDs with regard to electrostatic resistance according to the second embodiment of the present invention.
Figure 10:
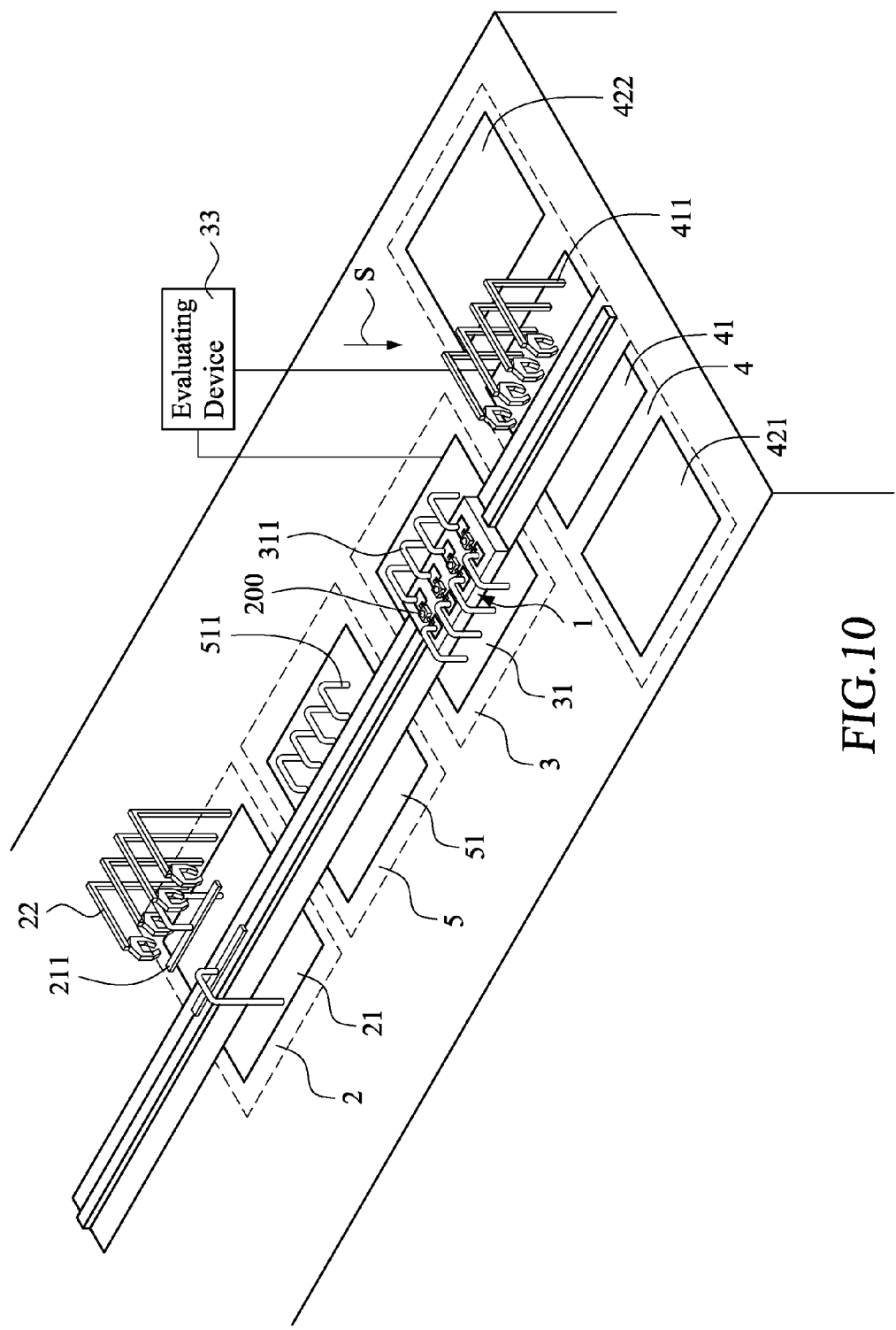
FIG. 10 is the third schematic drawing illustrating a operate state of a system for automatically sorting LEDs with regard to electrostatic resistance according to the second embodiment of the present invention.

Please refer to FIG. 6, it is a flow chart of a method for automatically sorting LEDs based on electrostatic resistance according to the second embodiment of the present invention. The method for automatically sorting LEDs of the second embodiment is similar with the method for automatically sorting LEDs in the first embodiment. The method for automatically sorting LEDs in the second embodiment is different from the method for automatically sorting LEDs in the first embodiment as follows. First, the method further includes a step 21 of arranging the electrode of the LEDs 200 after step 20. Second, the method further includes a step 23 of moving the transport carrier to an electrostatic eliminating zone and a step 24 of eliminating the electrostatic existing in the LEDs 200 after step 22. Third, the method does not include the step 31 of eliminating the electrostatic existing in the LEDs 200 and the step 32 of arranging the electrode of the LED.

Please refer to FIG. 7 to FIG. 10 with corresponding to FIG. 6, the second embodiment of the present invention is described in detail below.

The system for automatically sorting LED according to electrostatic resistance 100a is similar with the system for automatically sorting LED according to electrostatic resistance 100 in the first embodiment. The elements in the second embodiment illustrated in these four Figs. are similar to those in the first embodiment. Thus, the elements which have the same function as in the first embodiment are labeled with the same reference numbers.

The first difference between the second embodiment and the first embodiment is that the system for automatically sorting LEDs according to electrostatic resistance 100a is further provided with an electrostatic eliminating zone 5. The electrostatic eliminating zone is provide with an electrostatic eliminating device 51, and the system for automatically sorting LEDs according to electrostatic resistance 100a is able to eliminate electrostatic faster than the system for automatically sorting LEDs according to electrostatic resistance 100. The detecting path P' extends through the electrostatic discharging zone 2, the electrostatic eliminating zone 5, the lightening evaluating zone 3, and the sorting zone 4 in sequence. The LEDs 200 is transported by the transport carrier 1 along the detecting path P' (step 12). The transport carrier 1 is transported from the electrostatic discharging zone 2 to the electrostatic eliminating zone 5 (step 23). The electrostatic eliminating device 51 can generate the high density positive ions and the high density negative ions for stabilize the electrical potential to eliminate the electrostatic existing in the LEDs 200. The electrostatic eliminating member 511 of the electrostatic eliminating device 51 is electrically connected with the LEDs 200, and is for eliminating the electrostatic existing in the LEDs 200 via the electric conducting member 11 (step 24). The electrostatic eliminating device 51 can be replaced by other device with electrostatic eliminating function, such as, a electrostatic elimination blower and so on.

The second difference between the second embodiment and the first embodiment is that the electrostatic discharging zone 2 of the system for automatically sorting LEDs according to electrostatic resistance 100a is further provided with an electrode arranging member 22, and the lightening evaluating zone 3 do not provide with the electrode arranging member 32.

While the transport carrier 1 is moved to the electrostatic discharging zone 2(step 20), the electrode arranging member 22 is provided to arrange the electrode of the LEDs 200 according to the direction of electrical flow corresponding to the lighting device 31(step 21). As previously mentioned, the electrode of the LEDs 200 can be previously known in various ways, so the electrode arranging member 22 is not a necessary member, and the step 21 is not a necessary step. Thereafter, an electrostatic is discharged to the LEDs 200 on the transport carrier 1 in a way for keeping the electrostatic existing in the LEDs (step 22). Therefore, after step 30, there is not necessary to repeatedly eliminate electrostatic within the LEDs (step 31), and to arrange the electrode of the LEDs (step 32) as in the second embodiment. The subsequent steps, such as the aforementioned in first embodiment, are the same.

As can be appreciated from the above embodiments, the system for automatically sorting LED according to electrostatic resistance 100, 100a are able to detect the electrostatic resistance of the LEDs more efficiently than the prior art, and thus the reliability of both the failure rate and the detection rate is improved.

The above description should be considered as only the discussion of the preferred embodiments of the present invention. However, a person skilled in the art may make various modifications to the present invention. Those modifications still fall within the spirit and scope defined by the appended claims.

What is claimed is:

1. A method for automatically sorting LED according to electrostatic resistance, comprising steps of:
    (a) laying, on a transport carrier, a LED to be tested;
    (b) transporting the LED for passing the LED through an electrostatic discharging zone, a lightening evaluating zone, and a sorting zone in sequence along a detecting path by the transport carrier;
    (c) in the electrostatic discharging zone, discharging an electrostatic power with a detecting voltage to the LED on the transport carrier through an electric conducting member by an electrostatic discharging device during an electrostatic discharging period;
    (d) in the lightening evaluating zone, inputting a lightening power to the LED on the transport carrier via an electrode of the LED electrically connecting with the electric conducting member by a lighting device and transmitting an evaluating signal to a sorting device according to the lighting condition of the LED; and
    (e) in the sorting zone, sorting the LED for moving the LED from the transport carrier to a collecting zone by the sorting device according to the evaluating signal.

2. The method for automatically sorting LED according to electrostatic resistance as claimed in claim 1, wherein, in the step (c), the electrostatic power is a pulse-type electrostatic power.

3. The method for automatically sorting LED according to electrostatic resistance as claimed in claim 1, wherein in the step (b) it further comprises a step of transporting the LED for passing the LED through an electrostatic eliminating zone existing between the electrostatic discharging zone and the lightening evaluating zone, and in a process between the step (c) and the step (d) it comprises a step of moving the transport carrier to the electrostatic eliminating zone for eliminating the electrostatic within the LED through the electric conducting member by means of an electrostatic eliminating device.

4. The method for automatically sorting LED according to electrostatic resistance as claimed in claim 1, wherein in the step (d) it further includes a step of eliminating the electrostatic within the LED through the electric conducting member by the lighting device before inputting the lightening power to the LED.

5. The method for automatically sorting LED according to electrostatic resistance as claimed in claim 1, before the step (d) it further comprising a step of arranging the electrode of the LED according to the power output of the lighting device to arrange a positive electrode and a negative electrode of the LED.

6. A system for automatically sorting LED according to electrostatic resistance, comprising:
    a transport carrier, provided with an electric conducting member, for laying a LED and passing the LED through an electrostatic discharging zone, a lightening evaluating zone, and a sorting zone in sequence along a detecting path;
    an electrostatic discharging device provided in the electrostatic discharging zone, the electrostatic discharging device being electrically connected with the electric conducting member for discharging an electrostatic power with a detecting voltage to the LED on the transport carrier through the electric conducting member while the transport carrier is in the electrostatic discharging zone;
    a lighting device and an evaluating device provided in the lightening evaluating zone, the lighting device being electrically connected with the electric conducting member for inputting a lightening power to the LED on the transport carrier through the electric conducting member, and the evaluating device being transmitted an evaluating signal according to the lighting result of the LED while the transport carrier is in the lightening evaluating zone; and
    a sorting device provided in the sorting zone, the sorting device connected with the evaluating device to sort the LED for moving the LED from the sorting zone to a collecting zone according to the evaluating signal.

7. The system for automatically sorting LED according to electrostatic resistance as claimed in claim 6, wherein the transport carrier further includes an insulating member, and the electric conducting member is disposed on the insulating member.

8. The system for automatically sorting LED according to electrostatic resistance as claimed in claim 6, further comprising an electrode arranging member in the electrostatic discharging zone.

9. The system for automatically sorting LED according to electrostatic resistance as claimed in claim 6, further comprising an electrode arranging member in the lightening evaluating zone.

* * * * *